United States Patent [19]

Wouda et al.

[11] Patent Number: 4,772,860
[45] Date of Patent: Sep. 20, 1988

[54] PHASE-CONTROL LOOP

[75] Inventors: Kornelis J. Wouda, Nuenen; Paul Zuidweg, Waalre, both of Netherlands

[73] Assignee: AT&T Philips Telecommunications B.V., Hilversum, Netherlands

[21] Appl. No.: 74,125

[22] Filed: Jul. 17, 1987

[30] Foreign Application Priority Data

Jul. 17, 1986 [NL] Netherlands ............................ 8601870

[51] Int. Cl.$^4$ ................................................. H03L 7/06
[52] U.S. Cl. ...................................... 331/1 A; 331/17; 331/25
[58] Field of Search .................... 331/1 A, 18, 17, 25; 375/120

[56] References Cited

U.S. PATENT DOCUMENTS 4,179,670 12/1979 Kingsbury .......................... 331/16 X
4,365,210 12/1982 Harrington et al. ................. 331/1 A Primary Examiner—Eugene R. LaRoche
Assistant Examiner—David Mis
Attorney, Agent, or Firm—Lucian C. Canepa

[57] ABSTRACT

In digital systems clock signals are generated from an external clock reference signal for the purpose of synchronization with the aid of a phase-control loop 1 incorporating a frequency-controllable oscillator 2. In practice synchronization problems occur due to the phase inaccuracy of these clock signals relative to the clock reference.

By a two-level control of the oscillator frequency in a plurality of cycles, located within a period of the clock reference signal, using a pulse-width modulator 12, the phase accuracy of a clock signal to be derived from the oscillator output signal is improved.

In a preferred embodiment the loop 1 comprises: storage means 16, control means 17 and selection means 18 for providing in accordance with a given phase control strategy a phase-accurate oscillator output signal, this accuracy already being obtained on a small time scale.

5 Claims, 2 Drawing Sheets

PHASE-CONTROL LOOP

The invention relates to a phase-control loop, including a frequency-controllable oscillator having a control input, a phase comparator coupled to a signal input of the loop and to the oscillator output and a control circuit connected to the output of the phase comparator and to the control input of the oscillator for applying a control signal to the control input of the oscillator for locking the loop.

Such a phase-control loop is generally known and is used inter alia in digital transmission systems in which a plurality of different procedures are synchronously performed. Generally, a reference signal having a relatively low frequency and being applied to the second input of the loop is present in such systems. At phase measuring instants determined by the reference signal, the phase comparator compares the phases of the reference signal and a signal which is generally derivable from the oscillator output signal via a divider. The control circuit derives a control signal for the oscillator from the phase comparator output signal. The oscillator output signal of a comparatively high frequency is then available as a phase-controlled clock signal required for the synchronization of said procedures.

In practice, however, it has been found that the phase deviations between both the clock signal and the reference signal and also between clock signals derived from a similar reference signal are too great, so that synchronizing problems occur.

Ihe invention has for its object to provide a phase-control loop which can be realized in digital technique, in which the oscillator output signal has a better instantaneous phase accuracy relative to the reference signal.

According to the invention, the phase-control loop is therefore characterized in that the control circuit includes a pulse-width modulator, the modulator having a control input coupled to the output of the phase comparator, an output connected to the control input of the oscillator and a signal input, for, on the basis of the frequency of a signal to be applied to the signal input of the pulse-width modulator, in at least two cycles located between two consecutive phase measuring instants, increasing and decreasing the oscillator output signal frequency within each cycle, during periods of time which are influencable by means of the pulse-width modulator.

By influencing the oscillator frequency in a plurality of cycles located between two consecutive phase measuring instants, by means of the pulse-width modulator control signal, on the basis of a dual control, the frequency of the oscillator output signal in each cycle being controlled both upwardly and downwardly during a brief period of time, an oscillator output signal is produced which has a small phase deviation peak value relative to the reference signal.

An embodiment of the phase-control loop according to the invention, is characterized in that the control circuit includes storage means arranged between the phase comparator output and the control input of the pulse-width modulator for storing and reading numerical values which are to be applied to the control input of the pulse-width modulator and represent the data of the periods of time located within each cycle during which the frequency of the oscillator output signal is upwardly and downwardly controllable.

The use of storage means in the control circuit provides several different numerical values, which accomplishes a refinement of the phase-detuning range of the oscillator, and consequently the phase deviation can accurately be kept under control. A further embodiment of the phase-control loop according to the invention, is characterized in that the control circuit includes control and selection means connected to the phase comparator output and to the control input of the pulse-width modulator for influencing the memory content of the storage means in dependence on a phase difference detected at a phase measuring instant, and for selecting from the storage means an appropriate numerical value to be applied to the pulse-width modulator. The use of the control and selection means in the control circuit offers the possibility of influencing, in accordance with a phase-control strategy to be determined hereinafter, the variation of the oscillator output signal phase whilst maintaining its phase accuracy.

A still further embodiment of the phase-control loop according to the invention, is characterized in that the storage means comprise a low (L) and a high (H) register and that influencing the contents of the two registers by means of the control and selection means and selecting the appropriate numerical value from the two registers is effected in accordance with a phase control strategy implemented in a programming section of the control means and comprising the following steps:

step 1, if the phase measurement indicates too low or too high a frequency of the signal to be coupled from the oscillator output to the phase comparator with respect to the input signal to be applied to the signal input of the loop, selecting the numerical value is effected in the high or low register, respectively, until the next phase measuring instant;

step 2, if after a phase measurement the registers are exchanged, only the content of the register used directly for the phase measurement is adapted, if the register used was the high register then its intent is decreased and if the register used was the low register its content is increased;

step 3, if after a phase measurement the same register is used as previously, the content of that register is always adjusted to its extreme value after the phase measurement, so that if the register was the high register, the content of the high register is increased and if the register was the low register the content of the low register is decreased.

Using this dynamic phase control strategy accomplishes that the phase control loop is continuously busy with having the oscillator frequency swing through the desired frequency values at a time scale of a few consecutive phase measurements, so that, even considered on this relatively small time scale, the instantaneous phase deviation remains small.

The invention and its advantages will now be described in greater detail by way of examples with reference to the accompanying Figures. Therein:

Figure 1:
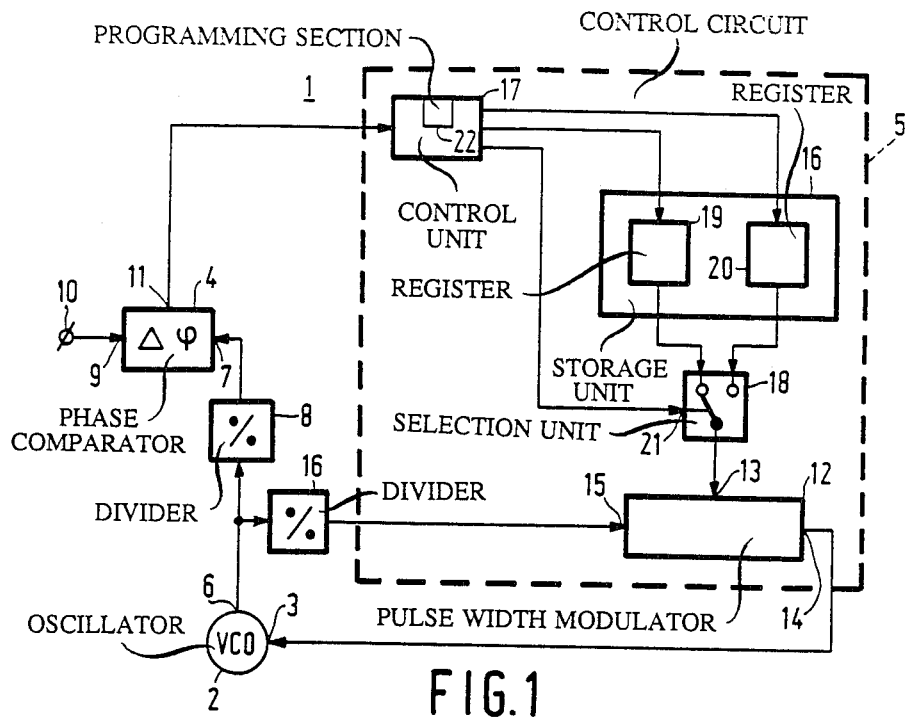
FIG. 1 shows a preferred embodiment of the phase-control loop according to the invention.

The phase control loop 1 shown in FIG. 1 is constituted by a frequency-controllable oscillator 2, for example a VCO (voltage controlled oscillator) having a control input 3. In addition, the loop 1 includes a phase comparator 4, a control circuit 5 and a divider 8 connected between the oscillator output 6 and a first signal input 7 of the phase comparator 4. The phase comparator 4 has a second signal input 9 connected to a signal input 10 of the loop 1 for applying, for example, a frequency or phase-stable (a low-jitter) reference signal, as the case may be, to the input 10. Furthermore, the phase comparator 4 has an output 11 from which an output signal can be taken, which signal depends on a phase difference measured between the signals at the two signal inputs 7, 9. The output 11 is connected to the control circuit 5 which is further connected to the control input 3 of the oscillator 2 for supplying, from the control input 3, a control signal by means of which the oscillator frequency is controlled for locking the loop 1.

Such a phase-control loop is used in electronic systems, more specifically in digital transmission systems for transmission registration, signal processing or filtering. Procedures which proceed synchronously with each other take place in different places in these systems. To that end, with the aid of the reference signal usually present, which has a relatively low frequency of, for example, 8 KHz, a clock signal having a relatively high frequency is derived from the oscillator output signal. When no control signal is applied to control input 3 of the oscillator 2 the oscillator frequency has a value of, for example, 7.68 MHz, the divider 8 then having a dividend of 960, to ensure that the frequency of the signals on the signal inputs 7 and 9 correspond to each other.

On the basis of the 8 KHz reference signal phase measurements are performed in the phase comparator 4 with 125 m. sec. intervals. The oscillator output frequency and consequently the phase are influenced in accordance with the results of these phase measurements.

Figure 2A:
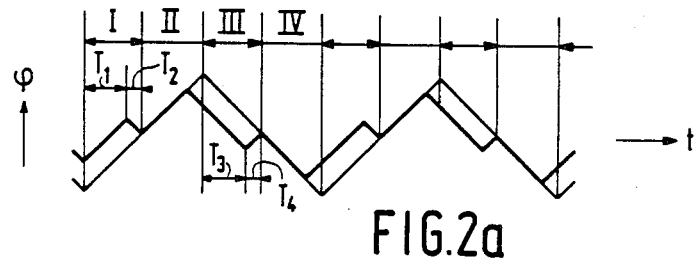
FIGS. 2a and 2b shows inter alia the stepped variation versus time of the phase ($\phi$) of the oscillator output signal in the phase-control loop of FIG. 1.
Figure 2B:
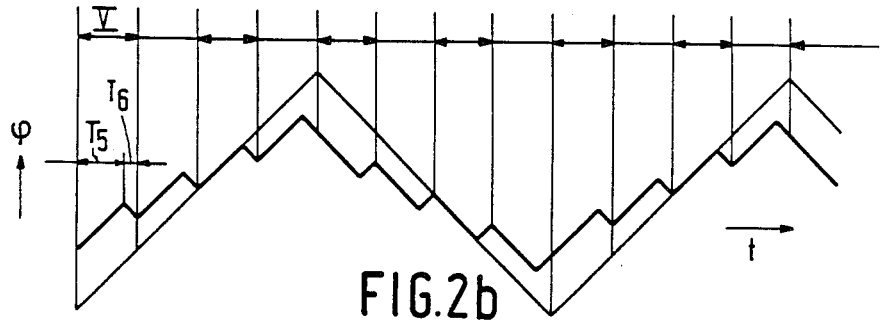

FIGS. 2a and 2b show of such a phase control, on mutually different scales, the generally triangular phase variation of the oscillator output signal as a function of time. When the frequency of the reference signal is chosen to be 8 KUz the interval between the vertices of the triangular variation corresponds to the 125 m. sec. intervals. Assuming the desired phase of the oscillator signal to be located between the projections of the vertical axis of the vertices, the oscillator frequency is always influenced at each vertex by a new result of the phase measurement.

In practice it has been found that the phase deviation of the oscillator output signal relative to the desired phase determined by the reference signal is too great for its successful use as a clock signal in digital transmission systems, for the purpose of synchronizing said procedures.

In order to obviate this, the control circuit 5 includes a pulse width-modulator 12, the modulator 12 having a control input 13 coupled to the output 11 of the phase comparator 4 and an output 14 connected to the control input 3 of the oscillator 2 and a signal input 15 for an up and down control within each cycle of the oscillator output signal frequency, on the basis of the frequency of a signal to be applied to the signal input 15 of the pulse-width modulator 12, in at least two cycles located between two consecutive phase measuring instants, during periods of time which are influenceable by the pulse-width modulator 12.

In FIGS. 2a and 2b these cycles are denoted by line sections of equal lengths which, are shown above the Figures in parallel with the time axis. FIG. 2a shows a sequence of always two cycles between two vertices which correspond with phase measuring instants. By way of illustration, FIG. 2b shows four cycles between consecutive phase measuring instants.

Within each cycle the oscillator frequency is subjected to a two-level control with the control signal of the pulse-width modulator 12, so that in each cycle the oscillator frequency is increased and decreased. Thus, the phase deviation now varies in steps as a function of time, as shown in FIGS. 2a and 2b. This results in a distinct decrease of the instantaneous phase deviation of the stepped phase variation, compared with the triangular phase variation, which will be still further described in the sequence. The phase-control loop 1 can be implemented in digital technique. Thus, the phase comparator 4 can be implemented as a sampling circuit, in which the signal is sampled at the first signal input 7 on the basis of the reference signal at the second signal input 9. The output signal at output 11 of the phase comparator 4 is then a two-level signal. This two-level output signal can, in principle, be applied directly to the control input 13 of the pulse-width modulator 12. During the 125 m. sec. interval the control signal at the control output 13 has, for example, a fixed first value. The pulse-width modulator 12 responds thereto by applying a two-level control signal to the control input 3 of the oscillator 2 during a cycle time $(T_1+T_2)$ to be determined by the frequency of the signal at the signal input 15. During a time $T_1$ in the cycle, designated by I, the oscillator frequency consequently increases, followed by a time $T_2$ in the cycle I in which the oscillator frequency decreases. As $T_1$ exceeds $T_2$, and in the situation shown here, the extent to which the phase increases versus time during $T_1$ is equal to the extent to which the phase decreases versus time during $T_2$, the phase has increased, on balance, at the end of this cycle. In a subsequent, identical cycle, denoted by II, the phase increases to an equal extent. During the next 125 m. sec. interval the control signal at control input 13 has a fixed, second value. In a similar manner as already described in the foregoing, the oscillator frequency now decreases during a period of time $T_3=T_1$ and increases during a period of time $T_4=T_2$. On balance, the phase consequently decreases in this cycle, denoted by 111. For the subsequent cycle, denoted by IV, the phase decreases to an equal extent. This results in the obvious stepped variation of the phase of the oscillator output signal as a function of time, which results in a distinctly smaller instantaneous phase deviation compared to the triangular phase variation. FIG. 2b shows, on a twice larger scale, a similar phase variation as shown in FIG. 2a. However, now a 125 m.sec. interval between two consecutive vertices of the triangular phase variation is divided into four equal cycles. In a cycle, denoted by V, time periods $T_5$ and $T_6$ are shown, during which in a similar manner as already described in the foregoin, the phase $\phi$ increases and decreases, respectively. In this second case the cycle time is $T_5+T_6$, which consequently is twice shorter than the cycle time $T_1+T_2$ in the first case already described in the foregoing. Consequently, the frequency of the signal at the signal input 15 of the pulse-width modulator 12 is twice larger in the second case than in the first case. A comparison between the stepped phase variations in the two Figures clearly shows that the phase deviation of the phase variation shown in FIG. 2b, at a higher cycle frequency, consequently at a higher frequency of the signal to be applied to the signal input 15, is less than the corresponding variation shown in FIG. 2a. Hence, in order to obtain a small oscillator frequency phase deviation the frequency of the signal to be applied to the signal input 15 is preferably chosen to be high relative to the reference signal frequency.

Optionally, the oscillator output 6 can be directly connected to the signal input 15. In the case in which the oscillator frequency amounts to 7.68 MUz, it was found that in practice a sufficiently small please deviation can be obtained if a divider 16 is arranged, for example in the manner shown in FIG. 1, between output 6 and input 15. Ihe divider 16 may have a dividend of, for example, 15, so that the cycle frequency amounts to 512 KUz and, for a 8 KUz reference signal frequency, 64 cycles are consequently located in a 125 m. sec. interval. It then appears that the peak value of the phase deviation between the oscillator output signal and the reference signal is sufficiently small to derive from the oscillator output signal a clock signal which can be used successfully for synchronizing without any synchronization problems the different procedures in digital transmission systems.

In a further embodiment, the control circuit 5 includes storage means 16 arranged between the output 11 of the phase comparator 4 and the control input 13 of the pulse-width modulator 12. Ihe further embodiment of the phase-control loop 1 is not separately shown in one of the Figures. The storage means 16 are indeed shown in FIG. 1 in an embodiment which will be described in greater detail in the sequel of this description.

The storage means 16 contain, for example, fixed data which can be read for application to the control input 13 of the pulse-width modulator 12. These data are in the form of numerical values which, for example, represent the ratios $(T_1/T_2; T_3/T_4 \text{ or } T_5/T_6)$ of the periods of time ($T_1$ to $T_6$) located within each cycle, during which the frequency of the oscillator output signal can be increased and decreased. Depending on the cycle frequency, predetermined pairs of possible numerical values can be applied to the control input 13. Depending on the result of the phase measurements, one of the two numerical values of a pair of values is applied to input 18 together with the two-level output signal at output 11 of the phase comparator 4. Because several different numerical values are available in the storage means 16, a refining of the phase tuning range of the oscillator 2 is obtained, by means of which the phase deviation can be more accurately controlled.

Figure 3:
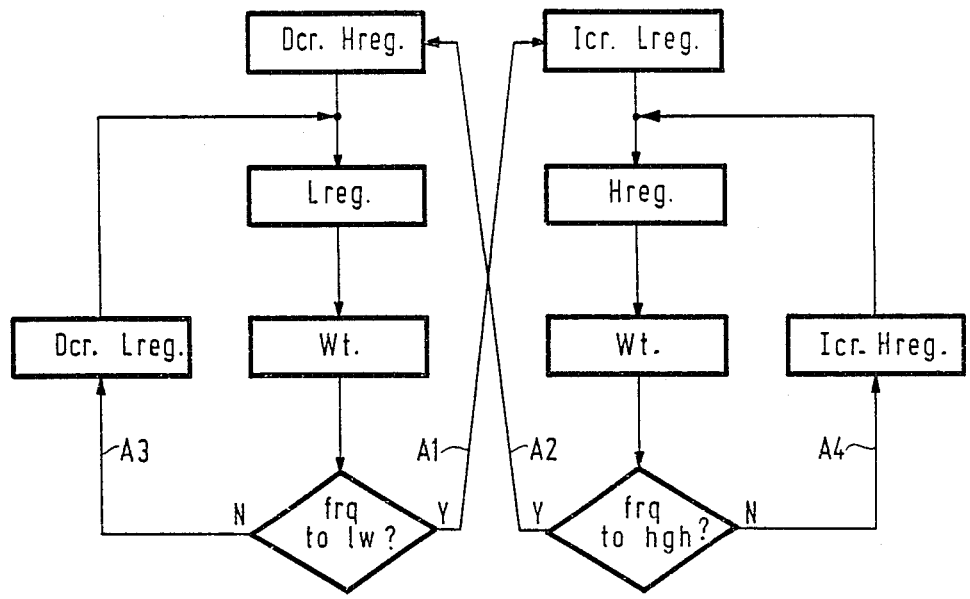
FIG. 3 is the flow chart of a possible phasecontrol strategy for use in the phase-control loop of FIG. 1.

In the embodiment, still further to be described, of the phase-control loop 1 shown in FIG. 1, the control circuit 5 includes control means 17 and selection means 18 connected to the output of the phase comparator 4 and to the control input 13 of the pulse-width modulator 12. The content of the storage means 16 is influenced with the aid of the control means 17 in dependence on a phase difference determined at a phase measuring instant. Consequently, the data contained in the storage means 16 are now not of necessity fixed data. Using the selection means 18, an appropriate numerical value is now selected from the variable storage content and thereafter applied to the control input 13 of the pulse-width modulator 12. Using the control means 17 and the selection means 18 provides the possibility to influence the variation of the oscillator output signal phase in accordance with a phase control strategy still further to be determined, whilst maintaining its phase accuracy. FIG. 3 shows the flow chart of a possible phase control strategy for use in the phase-control loop 1.

In the embodiment shown in FIG. 1, the storage means 16 include a low (L) register 19 and a high (H) register 20. Ihe registers 19, 20 are connected to the control means 17, for controlling their memory content. For the purpose of selecting from one of the two registers 19, 20 a numerical value to be applied to the control input 13, the selection means 18 are in the form of a controllable selection circuit (shown in FIG. 1 as a change-over switch), having a control input 21 connected to the control means 17. The phase control strategy in accordance with which influencing the content of the registers 19, 20 and selecting the appropriate numerical value from the registers 19, 20 is effected is implemented in a programming section 22 of the control means 17.

The flow chart of the phase control strategy, shown in FIG. 3, comprises the following steps shown in the form of boxes:

step 1, when the phase measurement (boxes "freq. too low" or "freq. too high", respectively) indicates too high or too low a frequency of the signal at the first signal input 7 relative to the reference signal at the second signal input 9 of the phase comparator 4 (path A1 or A2, respectively), the numerical value is selected in the high register 20 (box "H reg") or the low register 19 (box "L reg"), respectively, until the subsequent phase measuring instant;

step 2, when a change of register is effected after a phase measurement (on passing through path A1 or path A2), only the conient of the register directly used for this phase measurement is adapted, when the register used was the high register 20 (path A2) then the content thereof is decreased (box "Dcr. H reg.") and when the register used was the low register 19 path A1) then the content thereof is increased (box "Icr. L. reg.");

step 3, when after a phase measurement the same register is used as previously (on passing through path A3 or path A4), the content of that register is always adjusted after this phase measurement to its extreme value, so that if the register used was the high register 20 (path A4), the content of the high register 20 is increased (box "Icr. H reg.) and when the low register 12 was used (path A3), the content of the low register 19 is decreased (box "Dcr. L reg.).

Ihe block "Wt" indicates that during the interval between two consecutive phase measuring instants, 125 m. sec. in said example, the content of the register shown in the box above the box "Wt" is conveyed by the selection means 18 to the control input 13 of the pulse-width modulator 12.

This dynamic phase control strategy provides that the phase-control loop 1 is continuously engaged in having the oscillator frequency or phase, as the case may be, to swing to and fro across the desired frequency or phase value, as the case may be, on a time scale covering a few consecutive phase measurements.

All this will be described in greater detail with reference to an example illustrated in FIGS. 4a and 4b of a possible variation as a function of time of the contents of the high (H) register 20 and the low (L) register 19, when the phase-control strategy shown in FIG. 3 is used. The content of the registers 19, 20 ("cntnt") are noted along the vertical axis in the form of symbolic numerical values 0, 2, 4 and 6. The upper portion of the vertical axis relates to the content of the H register 20, the lower portion relates to the L register 19. As has already been described in the foregoing these numerical valves represent the different ratios of the time periods in which the oscillator frequency can be controlled up and down, respectively, within a cycle. Thus, the H register contains, for example, one after the other the numerical values correspondin to the ratio between the times $T_1$ and $T_2$ and the L register contains the numerical values corresponding to the ratio between the times $T_3$ and $T_4$, such as these times are shown in FIG. 2a.

Figure 4A:
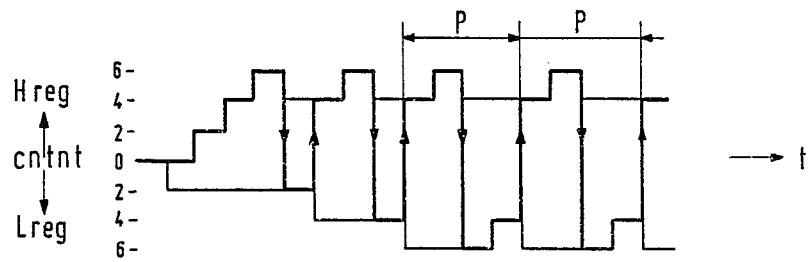
FIG. 4a and 4b show diagrams in which the variation of the content of the high and the low-registers is shown as a function of time when the phase control strategy shown in FIG. 3 is used.
Figure 4B:
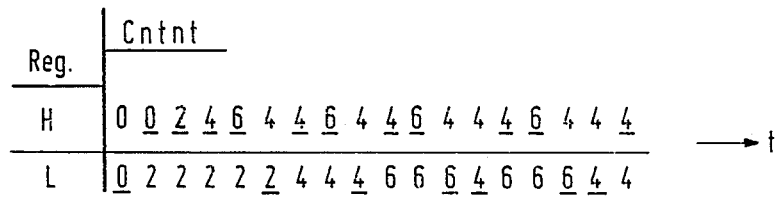

For a further explanation, FIG. 4b shows in the form of digits the variation, corresponding to FIG. 4a, as a function of time of the numerical values in each of the registers H and L. The upper row illustrates the variation of the content of the U register 20; the lower row illustrates the variation of the content of the L register 19. Each time the underlined numerical value is selected from the register assigned to the relevant row for application to the control input 13 of the pulse-width modulator 12. The variation of the underlined numerical values corresponds to the variation of the solid line in FIG. 4a.

In this example, at the start, the contents of the two registers H and L are equal to zero. Let it be assumed that the control input 13 receives the symbolical numerical value zero, from the L register 19 (box "L reg."). Let it further be assumed that the symbolic step size; at an increase or a decrease of the contents of the registers 19, 20 is equal to two and that the desired oscillator frequency is reached at a symbolical numerical value equal to five at the control input 13. The phase control strategy then proceeds as follows (it being assumed that the oscillator frequency responds without an inertia of an extent important for this explanation): box "L reg.", numerical value 0 from L register 19 during the 125 m. sec. interval to control input 13; (box "Wt") oscillator frequency is 0, should be 5 is consequently too low (path A1); (box "Icr. L reg.") content L register 19 becomes 2; under the control of a control signal at control input 21 of the selection means 18 a selection is made in the H register 20 (box "H reg."); during the subsequent 125 m. sec. interval the numerical value 0 is applied from the H register 20 to the output 13 (box "Wt"); oscillator frequency is 0, desired frequency is 5 (path A4); content H regisier 20 is increased (box "Icr. H reg."); content is now equal to 2 which in the next interval is conveyed to input 13; frequency is now 2, desired frequency is 5 consequently (path A4) increase content to 4; in a subsequent cycle to 6; then the frequency is 6, required is 5 consequently (path A2) content of H register 20 is now adjusted to 4 and a shift is effected to the low register 13 (box "L reg."). The content of the low register 19 is still 2; the content is conveyed to input 13, frequency is 2, required is 5, consequently path A1 content L register becomes 4 and a shift-back is effected to the H register whose content was 4, so too low, becomes 6 etc. etc. How this strategy proceeds further can be easily conceived by the reader.

In practice it appears that after some time a regularly returning pattern occurs in which a switch from one register to the other is effected every two intervals. In this pattern, denoted by P in FIG. 4a, the paths A1, A4, A2 and A3 are passed through one after the other. By this swing of the oscillator frequency to and fro across a desired frequency value every two 125 m. sec. intervals, the instantaneous phase deviation of the oscillator signal relative to the reference signal remains small even averaged over this relatively small time scale. In addition, the phase control strategy described in the foregoing is very robust, that is to say that any random initial filling of the registers 19, 20 results in a uniform pattern, after some time has elapsed. Even for the case in which the low register 19 has a much higher value than the high register 20, the phase control strategy described results in a final situation in which the pattern returns regularly, as can be easily verified.

If so desired, the frequency and numerical values used in this explanatory description, can be changed in a manner which will be obvious for a person skilled in the art. It is, for example, alternatively possible to change the number of possible symbolic numerical values in the registers 19, 20. In practice it was found that 16 possible numerical values are already sufficient in the above-described example at a 8 KHz reference frequency and a 7.68 MHz oscillaior frequency. In that situation the registers 19, 20 were implemented as 4-bit two-way counters.

What is claimed is:

1. A phase-control loop including a frequency-controllable oscillator having a control input, a phase comparator coupled to a signal input of the loop and to the oscillator output and a control circuit connected to the output of the phase comparator and to the control input of the oscillator for applying a control signal to the control input of the oscillator for locking the loop, characterized in that the control circuit includes a pulse-width modulator, the modulator having a control input coupled to the output of the phase comparator, an output connected to the control input of the oscillator and a signal input for, on the basis of the frequency of a signal to be applied to the signal input of the pulse-width modulator, in at least two cycles located between two consecutive phase measuring instants increasing and decreasing the oscillator output signal frequency within each cycle during periods of time which are influenceable by the pulse-width modulator.

2. A phase-control loop as claimed in claim 1, characterized in that the control circuit includes storage means arranged between the phase comparator output and the control input of the pulse-width modulator for storing and reading numerical values which are to be applied to the control input of the pulse-width modulator and represent the data of the periods of time located within each cycle, during which the frequency of the oscillator output signal is upwardly and downwardly controllable.

3. A phase-control loop as claimed in claim 2, characterized in that the control circuit includes control and selection means connected to the phase comparator output and to the control input of the pulse-width modulator for influencing the memory content of the storage means in dependence on a phase difference determined at a phase measuring instant and for selecting from the storage means an appropriate numerical value to be applied to the pulse-width modulator.

4. A phase-control loop as claimed in claim 3, characterized in that the storage means comprise a low (L) and a high (U) register, and that influencing the content of the two registers by means of the control and selection means and selecting the appropriate numerical value from the two registers is effected in accordance with a phase control strategy implemented in a programming section of the control means and comprising the following steps:
- step 1, if the phase measurement indicates too low or too high a frequency, respectively of the signal to be coupled from the oscillator output to the phase comparator with respect to the input signal to be applied to the signal input of the loop, selecting the numerical value is effected in the high or low register, respectively, until the next phase measuring instant;
- step 2, if after a phase measurement the registers are exchanged, only the content of the register used directly for the phase measurement is adapted, if the register used was the high register then its content is decreased and if the register used was the low register its content is increased;
- step 3, if after a phase measurement the same register is used as previously, the content of that register is always adjusted to its extreme value after the phase measurement, so that, if the register used was the high register, the content of the high register is increased and if the register used was the low register the content of the low register is decreased.

5. A phase-control loop as claimed in any one of the claims 1 to 4, characterized in that the loop includes a divider connected between the oscillator output and the signal input of the pulse-width modulator.

* * * * *